United States Patent
Jeon et al.

(10) Patent No.: US 7,602,004 B2
(45) Date of Patent: Oct. 13, 2009

(54) SEMICONDUCTOR DEVICE AND METHODS FOR FORMING THE SAME

(75) Inventors: Hee-Seog Jeon, Hwaseong-si (KR); Jeong-Uk Han, Suwon-si (KR); Hyok-Ki Kwon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 325 days.

(21) Appl. No.: 11/585,493

(22) Filed: Oct. 24, 2006

(65) Prior Publication Data

US 2007/0091676 A1   Apr. 26, 2007

(30) Foreign Application Priority Data

Oct. 24, 2005   (KR) ............. 10-2005-0100409

(51) Int. Cl.
*H01L 29/788*   (2006.01)
(52) U.S. Cl. .............. 257/315; 257/E27.102
(58) Field of Classification Search .......... 257/368, 257/390, 391, 392, 315, 316, E21.671; 365/185.05, 365/185.17, 94
See application file for complete search history.

(56) References Cited

U.S. PATENT DOCUMENTS 5,792,699 A    8/1998  Tsui
6,133,101 A *  10/2000 Wu ....................... 438/276
6,207,999 B1    3/2001 Wu
6,323,091 B1 * 11/2001 Lee et al. ................ 438/275
6,380,044 B1    4/2002 Talwar et al.
2002/0052083 A1  5/2002 Zhang et al.

FOREIGN PATENT DOCUMENTS

| JP | 2004-079895 | 3/2004 |
| KR | 1998 05450-8 | 9/1998 |
| KR | 100213237 | 5/1999 |
| KR | 2002 0002012 | 1/2002 |

OTHER PUBLICATIONS

German Office Action for Patent Application No. 10 2006 051 290.1-33; dated Jan. 29, 2008.
English Abstract for Publication No. 1998-054508.
English Abstract for Publication No. 1020020002012.

* cited by examiner

*Primary Examiner*—Thomas L Dickey
*Assistant Examiner*—Fazli Erdem
(74) *Attorney, Agent, or Firm*—F. Chau & Associates, LLC

(57) ABSTRACT

A semiconductor device includes a first transistor and a second transistor formed on a substrate. Each of the first transistor and the second transistor has a first source region, first drain region of a first conductivity type and a gate. The first transistor is an off-transistor and includes a second source/drain region of the first conductivity type which surrounds at least a portion of the first source/drain region in the first transistor.

17 Claims, 5 Drawing Sheets

SEMICONDUCTOR DEVICE AND METHODS FOR FORMING THE SAME

CROSS-REFERENCE TO RELATED APPLICATION

This application claims priority from Korean Patent Application No. 10-2005-100409, filed Oct. 24, 2005, the disclosure of which is hereby incorporated by reference herein in its entirety.

BACKGROUND OF THE INVENTION

1. Technical Field

The present disclosure relates to a semiconductor device and to a method of forming the same and, and more particularly, to a semiconductor device with a high breakdown voltage and to a method of forming the same.

2. Description of the Related Art

A cell array of a mask read only memory (ROM) in semiconductor memory devices may include an on-transistor and an off-transistor. In forming the off-transistor of the cell array, transistors with a low threshold voltage Vth are typically formed on an entire array region. Next, a dopant (e.g., p-type dopant, boron) of a conductive type, which is opposite to that of a source region and a drain region of the on-transistor, is selectively doped on a channel region of the transistor using a masking process. The above-mentioned masking process results in the transistor becoming an off-transistor with a high threshold voltage. Moreover, predetermined data is formed using the on-transistor and the off-transistor during the semiconductor device manufacturing processes.

FIG. 1 is a graph illustrating a change of a well density and a transistor breakdown voltage BVdss in an on-transistor and an off-transistor according to a design rule of a conventional semiconductor device. In the above off-transistor, when the size of a semiconductor device is reduced, the dopant concentration of the channel region in the semiconductor device should be increased to obtain an appropriate threshold voltage. Moreover, the junction breakdown voltage may be reduced according to a gradually increasing density in a well and a semiconductor substrate, on which the semiconductor devices are formed. Additionally, when an additional ion injection is performed to form the off-transistor with a higher threshold voltage, the breakdown voltage may be even further reduced and the leakage current may be increased.

Thus, there is a need for a semiconductor device with a high breakdown voltage and to a method of forming the same.

SUMMARY OF THE INVENTION

In accordance with an exemplary embodiment of the present invention, a semiconductor device is provided. The semiconductor device includes a first transistor and a second transistor formed on a substrate. Each of the first transistor and the second transistor have a first source/first drain region, and a gate of a first conductive type, The first transistor is an off-transistor including a second source/second drain region of the first conductive type, which surrounds at least a portion of the first source/first drain region in the first transistor.

In some exemplary embodiments, the second source and the second drain may have a portion surrounding the first source and the second drain below the gate.

In further exemplary embodiments, the first source and the drain of the first transistor and the second transistor may be an N-type conductive type.

In other exemplary embodiments, the first source and the drain of the first transitor and the second transistor may be a P-type conductive type.

In other exemplary embodiments, the second transistor may be an on-transistor, and the first transistor may be an off-transistor having a dopant diffusion region into which a dopant of a conductive type opposite to the first source and the first drain is injected.

In other exemplary embodiments, the first transistor and the second transistor may be MOS transistors, and the semiconductor device may include a NOR-type mask ROM semiconductor device.

In other exemplary embodiments, the first off MOS transistor and the second on MOS transistor may have an N-type channel.

In accordance with an exemplary embodiment of the present invention, a method of forming a semiconductor device is provided. The method includes forming a first transistor and a second transistor each having a first source region, a first drain region, and a gate of a first conductive type, injecting a dopant of a second conductivity type in a channel region of the first transistor. The second conductive type being opposite to a first conductive type. The method further includes injecting a dopant of the first conductive type to form a second source region and a second drain region surrounding at least a portion of the first source region and the first drain region in the first transistor.

In some exemplary embodiments, the injecting of the dopant of a second conductivity on the channel region and the injecting of the dopant of a first conductivity type to form the second source region and the second drain region may use an identical photoresist layer.

In further exemplary embodiments, the first source region and the first drain region of the first transistor and the second transistor may be an N-type conductive type.

In other exemplary embodiments, the first source region and the first drain region of the first transistor and the second transistor may be a P-type conductive type.

In other exemplary embodiments, a dopant of a conductive type opposite to the first conductive type may be boron.

In other exemplary embodiments, the transistor having the injected channel region may be an off-transistor.

In-other exemplary embodiments, a P-type dopant may be injected to form the second source region and the second drain region.

In other exemplary embodiments, phosphorus may be injected to form the second source and the second drain at about 20 to about 40 keV.

In accordance with an exemplary embodiment of the present invention, a mask read only memory (ROM) semiconductor device is provided. The mask ROM semiconductor device includes a first transistor and a second transistor each having a first source region, a first drain region of a first conductive type and a gate. In addition, the first transistor is an off-transistor including a second source region and a second drain region of the first conductive type which envelops at least a portion of the first source region and the first drain region of the first transistor. Moreover, the second transistor is an on-transistor.

In some exemplary embodiments, the drain region of the first transistor is electrically connected to a bit line, and the gate is connected to a word line.

In accordance with still other exemplary embodiments of the present invention, a semiconductor device is provided. The semiconductor device includes at least one first transistor, at least one second transistor having an identical conductive type to and a different threshold voltage from that of the first transistor. The first transistor includes a buffer dopant region surrounding the source region and the drain region of the first transistor.

In some exemplary embodiments, the buffer dopant region may have density relatively lower than that of the source and the drain.

In further exemplary embodiments, the buffer dopant region may surround the source region and the drain region below a gate of the first transistor.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS

Figure 1:
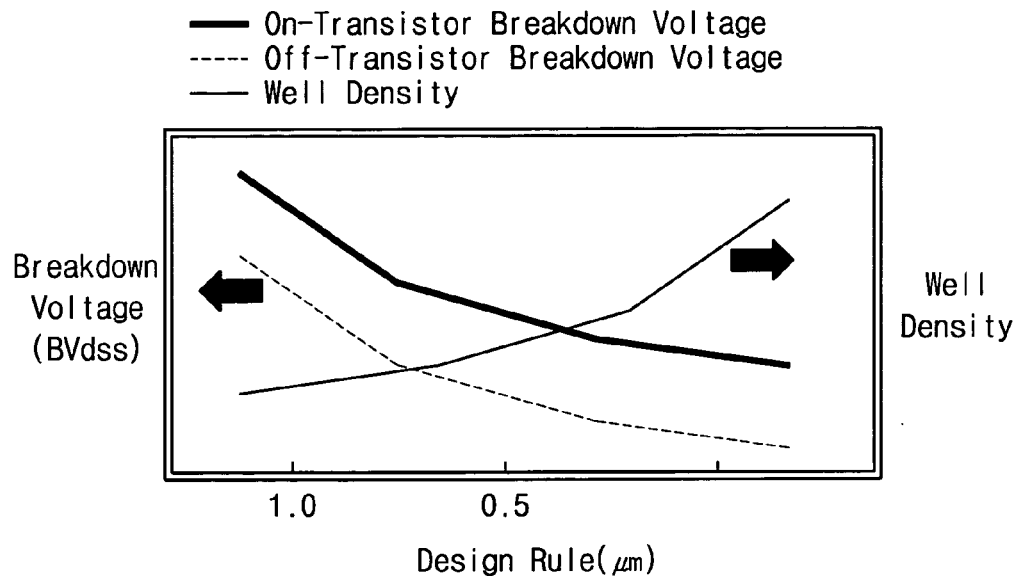
FIG. 1 is a graph illustrating a change of a well density and a transistor breakdown voltage BVdss in an on-transistor and an off-transistor according to a design rule.

Reference will now be made in detail to the exemplary embodiments of the present invention, examples of which are illustrated in the accompanying drawings. However, the present invention is not limited to the exemplary embodiments illustrated herein after Like reference numerals in the drawings denote like elements, and thus their detailed description will be omitted for conciseness.

A read only memory (ROM) in a semiconductor device maintains data in memory even when the power of the device is turned off. There are various memory devices with the same characteristic. For example, a mask ROM includes a cell array in which data is inputted during semiconductor manufacturing processes. Moreover, a mask ROM includes, for example, on-transistors and off-transistors.

Figure 2:
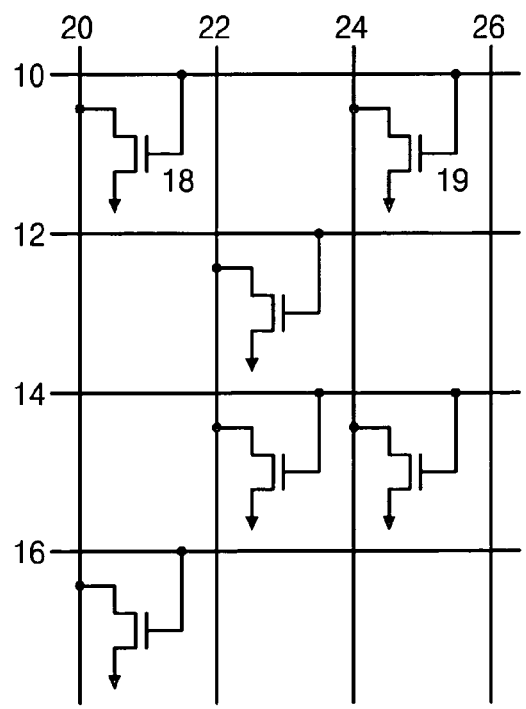
FIG. 2 is a circuit diagram of a mask ROM of a NOR array according to an exemplary embodiment of the present invention.

FIG. 2 is a circuit diagram of a mask ROM of a NOR-type array according to an exemplary embodiment of the present invention. In a NOR mask ROM, one transistor includes one bit. For example, N-type metal oxide semiconductor (MOS) transistors 18 and 19 are formed between each of word lines 10, 12, 14, and 16 and each of bit lines 20, 22, 24, and 26. Namely, each of the N-type MOS transistors is electrically connected to a word line and a bit line. An N-type MOS transistor is illustrated as an example in FIG. 2, but a P-type transistor can be used if desired.

Figure 3:
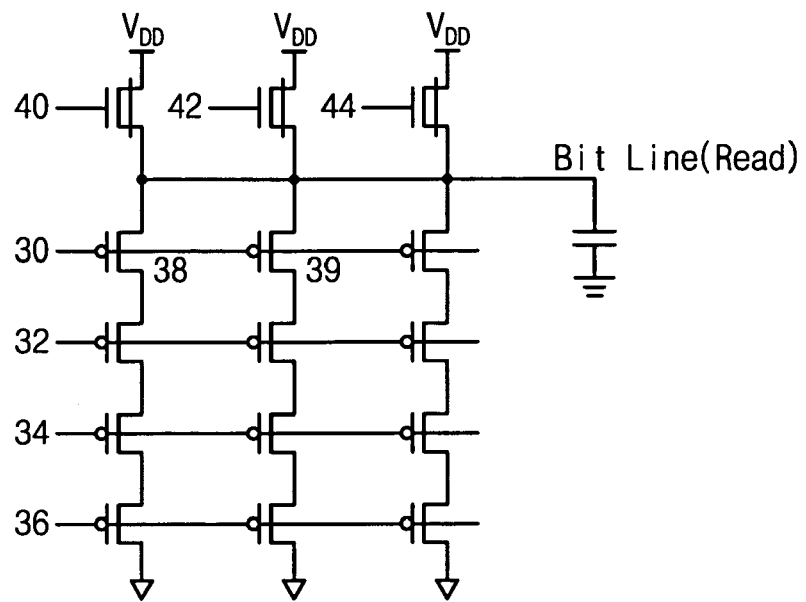
FIG. 3 is a circuit diagram of a mask ROM of a NAND array according to an exemplary embodiment of the present invention.

FIG. 3 is a circuit diagram of a mask ROM of a NAND-type array according to an exemplary embodiment of the present invention. Gates of the P-type transistors in respective rows are connected to respective word lines 30, 32, 34, and 36. For example, gates of the P-type transistors 38 and 39 are connected to the word line 30. A plurality of transistors in respective columns are connected in series to form respective strings. Adjacent transistors in column share source/drain regions. One end of a string is electrically connected to respective select transistors 40, 42, and 44 and the other end of the string is electrically connected to ground. Although the circuit diagram includes a P-type transistor, an N-type transistor can be used if desired.

According to a decrease of the design rule, the breakdown voltage of the transistor may be reduced due to the impurity concentration increase in the well and also the source and drain regions of the transistor. For example, off-transistors are subjected to a decrease in breakdown voltage.

As dopant concentration in the substrate or well increases, dopant concentration in source/drain regions of opposite conductivity type to the dopant in the substrate or well also increases. That is, as the difference between the dopant concentration of the source/drain regions and the substrate or well increases, the potential difference applied between the source/drain regions and the substrate or well increases. Consequently, the breakdown voltage in the transistor decreases.

Figure 4:
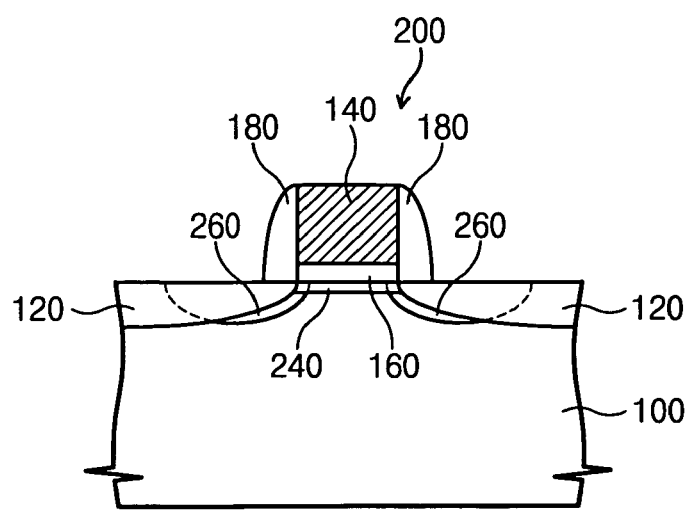
FIG. 4 is a sectional view of an off-transistor according to an exemplary embodiment of the present invention.

FIG. 4 is a sectional view of an off-transistor according to an exemplary embodiment of the present invention. The off-transistor 200 includes an N-type first source/first drain region 120, a gate 140 serving as an electrode in the transistor, a side wall spacer 180, a gate insulation layer 160, a dopant layer 240 controlling a threshold voltage, and second source/second drain regions 260 which are formed in the substrate 100. The dopant layer 240 is a P-type dopant region in an N-type MOS transistor. If the off-transistor 200 is a P-type MOS, the dopant layer 240 is an N-type dopant region. The second source/second drain regions 260 is the N-type dopant region in the N-type MOS transistor with an N channel. If the off-transistor 200 is a P-type MOS, the second source/second drain regions 260 is the N-type dopant region. The dopant -layer 240 can be formed by implanting a P-type dopant or impurity to transform an N-type on-transistor into an off-transistor. For example, a P-type dopant or impurity can be injected in the channel region of the N-type on-transistor to transform the N-type on-transistor into an off-transistor. Additionally, one or more dopant layers can be formed if desired.

Although a P-type MOS transistor can be used, an N-type MOS transistor is used in the method of forming the semiconductor of the present exemplary embodiment because of its fast operating speed. The method of forming the on/off-transistor can be applied to the NOR mask ROM with the N-type MOS transistors. The description of the method of the present exemplary embodiment will be made by referring to FIGS. 5A to 5D. Moreover, it is apparent that the exemplary embodiments of the present invention may also be applied to an NAND mask ROM of the N-type MOS transistor.

Figure 5A:
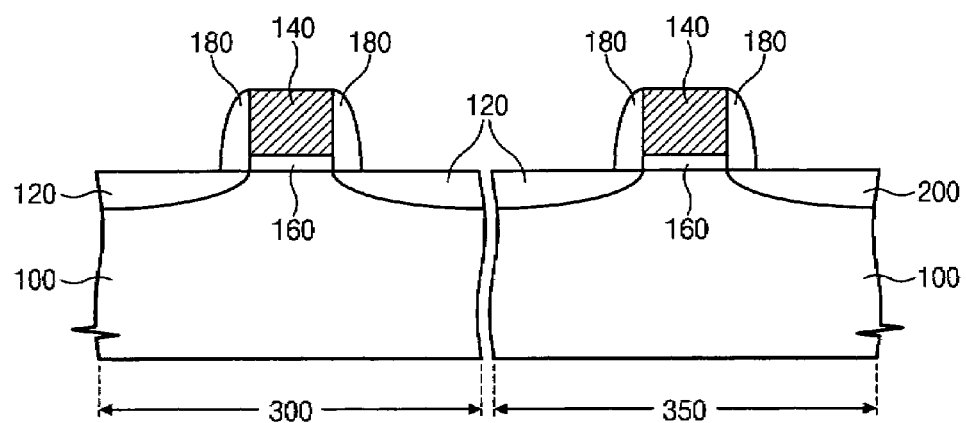
FIGS. 5A to 5D are sectional views illustrating a method of forming a transistor of a mask ROM device according to an exemplary embodiment of the present invention.

FIGS. 5A to 5D are sectional views illustrating a method of forming a transistor of a mask ROM device according to an exemplary embodiment of the present invention. In FIG. 5A, reference numerals 300 and 350, respectively, represent a region on which the off-transistor is formed, and a region on which the on-transistor is formed. For example, referring to FIG. 5A, an insulation layer 160 is formed on a substrate 100, and a conductive material layer (e.g., polysilicon or metal) is formed on the insulation layer 160. Additionally, a gate 140 is formed by a patterning process. Then, a sidewall spacer 180 is formed on the resultant structure. The sidewall spacer 180 can be formed by an anisotropy dry etching process after a silicon oxide layer is formed on the entire surface of the substrate 100. A gate insulation layer 160 is formed between the gate 140 and the substrate 100. The gate insulation layer 160 can be formed of a material selected from the group consisting of, for example, silicon oxide, silicon nitride, various high-k films having a high-k higher than that of the silicon oxide and the silicon nitride, and composite films of the various high-k films. Using the gate 140 and the sidewall spacer 180 as a mask, an N-type dopant is injected to form first source/first drain regions 120 of the on-transistor. The first source/first drain regions 120 are formed by injecting an N-type dopant, (e.g., ions including phosphorus P or arsenic As). For example, arsenic As with a relatively low coefficient of diffusivity can be used to form the source and drain regions 120. The substrate 100 can be a P-type or an N-type silicon semiconductor substrate. In the N-type silicon semiconductor substrate, a P-type well is formed on the substrate 100 to form an N-type MOS transistor. An organic substrate can also be used.

Figure 5B:
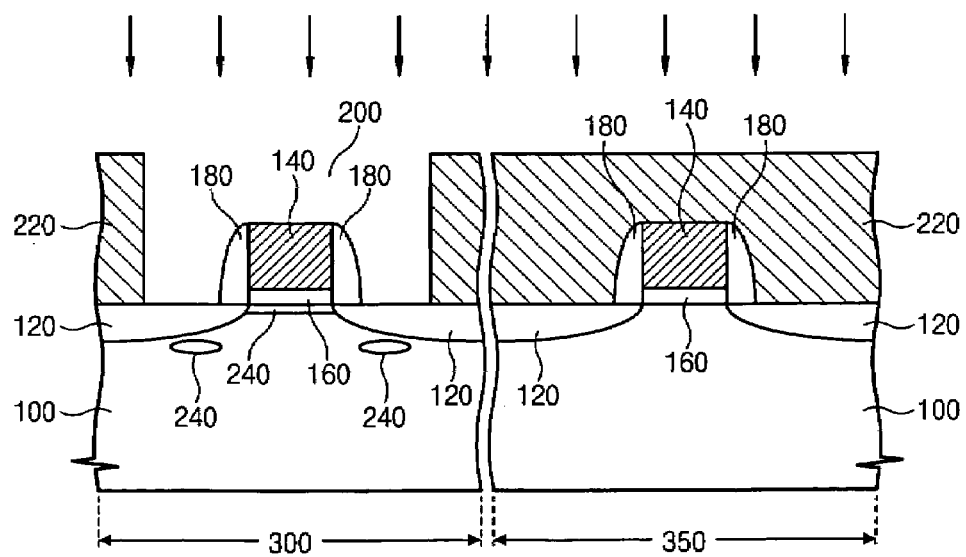

FIG. 5B is a sectional view illustrating an ion injecting process of a P-type dopant that controls a threshold voltage to form an N-type off-transistor. For example, a photoresist layer is applied to the entire surface of the substrate having the N-type on-transistor. The photoresist layer is patterned through a lithography process and an etching process, to form a photoresist pattern 220. The photoresist pattern 220 blocks an on-transistor region 350, and opens an off-transistor region 300. The P-type dopant (e.g., boron B or $BF_x$) is injected in a channel region of the on-transistor in the off-transistor region 300 to control a threshold voltage, and then off-transistor 200 is formed. According to an exemplary embodiment of the present invention, boron B of about 1E15 ions/cm$^2$ is injected at about 50 to about 150 keV, and thus a P-type dopant region 240 is formed to increase the channel concentration of the transistor in the substrate and the wells. The impurity injection can be adjusted such that the P-type dopant is injected into the channel region below the gate 140 in the off-transistor region 300. That is, the concentration of the P-type dopant increases more in the channel of the N-type off-transistor, and thus the potential difference increases in the channel between the first source/first drain regions 120. Accordingly, the threshold voltage of the on-transistor becomes low, but the threshold voltage of the off-transistor becomes high.

Figure 5C:
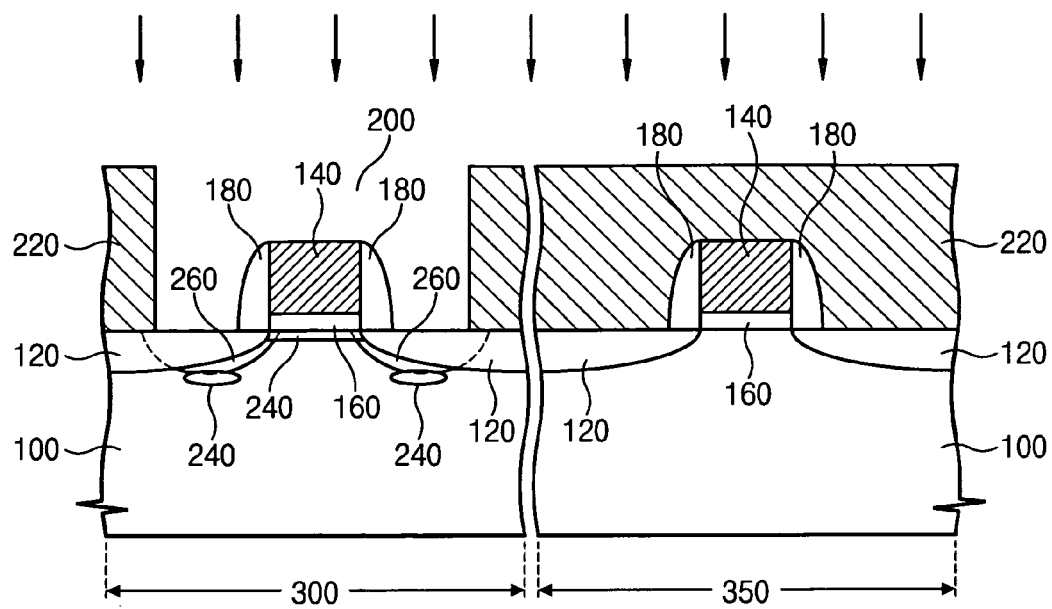

FIG. 5C is a sectional view illustrating an ion injecting process to increase the breakdown voltage of an N-type off MOS transistor 200. Second source/second drain regions 260 are formed by injecting an additional N-type dopant in the first source and first drain regions 120 of the N-type off-transistor 200 in the off-transistor region 300 so as to surround the first source/first drain regions 120. During the injection process, the N-type dopant is carefully applied such that it does not enter the channel region below the gate 140. For this, phosphorus P in N-type dopant is injected. In a subsequent process, phosphorus P is activated by, for example, a thermal process. The requirements of the N-type dopant injecting process for second source/second drain regions 260 may be varied depending upon, for example, the depth of the first source/first drain 120 regions. For example, according to an exemplary embodiment of the present invention, phosphorus P of about 20 E15 ions/cm$^2$ is injected at about 20 to about 40 keV to form second N-type source/drain regions 260 having a concentration less than that of the first source/first drain regions 120. The second N-type source/drain regions 260 form a buffer junction serving as a buffer in the first source/first drain regions 120 having a relatively high density to prevent the well of a high concentration from directly contacting the first source/first drain regions 120 of a high concentration, and thereby improving the breakdown voltage of the off-transistor. Although a great portion of the first source/first drain regions 120 are surrounded in FIG. 5C, the second N-type source/drain regions 260 can serve as a buffer below the gate insulation layer 160 in the transistor 200 of FIG. 4.

According to a modified exemplary embodiment of the present invention, after the second source/second drain regions 260 of a low concentration are formed using an N-type dopant (e.g., phosphorous P), the first source/first drain regions 220 can then be formed by using a dopant (e.g., arsenic As) having a coefficient of diffusivity lower than that of the impurity of the second source/second drain regions 260.

When a mask ROM is manufactured with the P-type MOS transistor, the first source/first drain regions 120 are formed using, for example, boron B, gallium Ga, indium In or a combination thereof. The second source/second drain regions 260 can be formed with a low density boron B to improve a breakdown voltage.

Figure 5D:
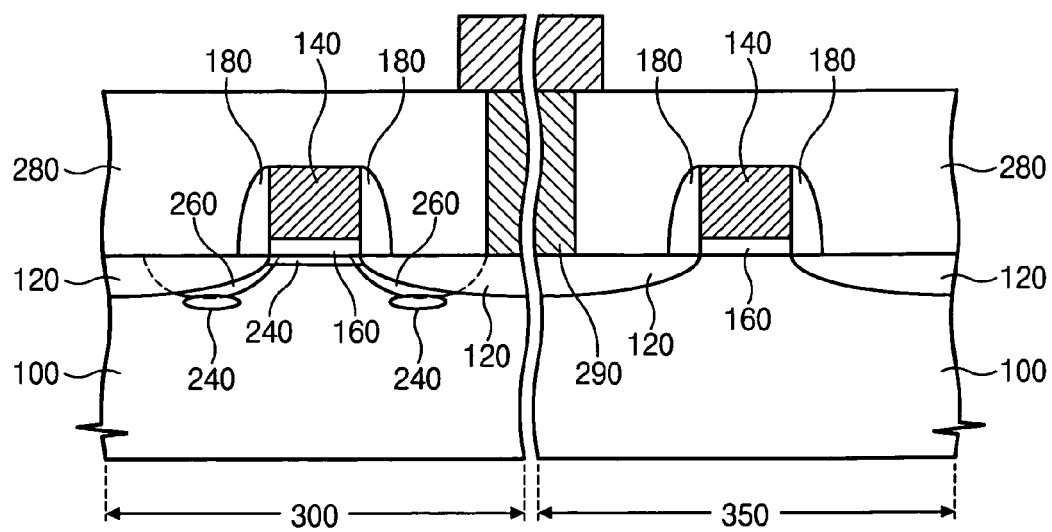

FIG. 5D is a sectional view illustrating a process forming an electrode on the semiconductor device. That is, after the first and second source/drain regions 120 and 260 are formed, silicon dioxide as an interlayer insulation layer 280 is formed on the entire surface of the substrate 100 on which the transistors are formed. Subsequently, a photoresist is applied and a contact hole is formed using a photolithography process and an etching process. Moreover, the contact hole is electrically connected to the source 120 or the drain 120 using a conductive material 290 (e.g., polysilicon, aluminum, and cupper).

Figure 6:
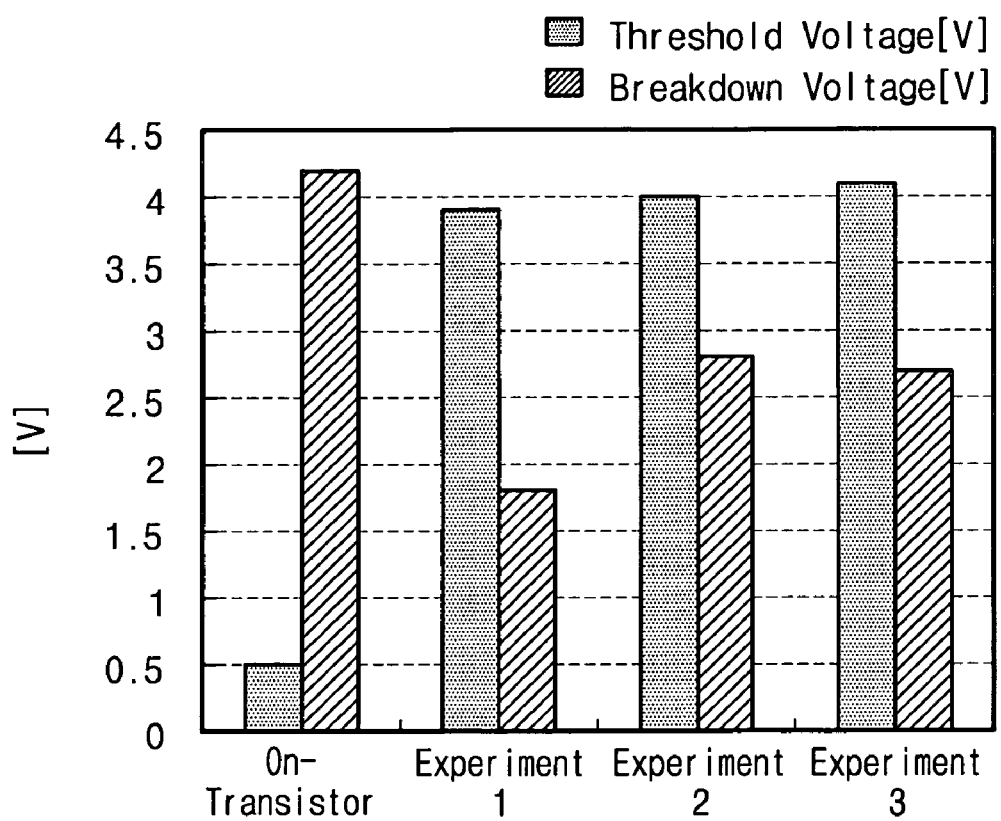
FIG. 6 is a graph illustrating a change of a breakdown voltage BV and a threshold voltage Vth in an on-transistor and an off-transistor according to whether ions are injected or not.

FIG. 6 is a graph illustrating a change of a breakdown voltage BV and a threshold voltage Vth in an on-transistor and an off-transistor. Changes to the threshold voltage and the breakdown voltage in the off-transistor are shown at an experiment 1, an experiment 2, and an experiment 3, respectively. In the graph, the threshold voltage and the breakdown voltage in the off-transistor are measured in the cell array of the N-type NOR mask ROM. In experiment 1, additional N-type dopant is not injected in the first source/first drain region. Moreover, in experiment 2 and 3 additional N-type dopant is not injected in the first source/first drain region. The threshold voltage of the off-transistor is about 3 Volt. When the additional N-type dopant is injected to form the second source/second drain regions 260, a breakdown voltage of about 1 Volt is improved.

Table 1 shows a change of a threshold voltage and a breakdown voltage in the N-type off-transistor according to experimental conditions and whether the second source and second drain is formed or not through an additional N-type dopant process. Referring to Table 1, a threshold voltage is changed in an amount of about 0.1 to about 0.2 Volt, but the breakdown voltage is changed in an amount of about 0.9 to about 1 Volt.

TABLE 1

|  | Experiment 1 | Experiment 2 | Experiment 3 |
|---|---|---|---|
| N-type ion injection for forming a buffer region | None | P+/30 KeV/2E15 | P+/30 KeV/1E15 |
| Threshold voltage V | 3.9 | 4.0 | 4.1 |
| Breakdown voltage V | 1.8 | 2.8 | 2.7 |

According to an exemplary embodiment of the present invention, an N-type or P-type semiconductor device having a high breakdown voltage and a method of forming the same is provided.

According to an exemplary embodiment of the present invention, an N-type mask ROM having off-transistors of a high breakdown voltage and a method of forming the same is provided.

According to an exemplary embodiment of the present invention, a mask ROM having a buffer junction region by injecting a dopant of a conductive type identical to that of the source region and the drain region and a method of forming the same is provided.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
    a first transistor and a second transistor formed on a substrate, each of the first transistor and the second transistor having a first source/first drain region of a first conductivity type, a gate and a spacer on a sidewall of the gate,
    wherein the first source/first drain region in the first transistor includes a first portion disposed under the spacer and a second portion not covered by the spacer, the first portion between the second portion and the gate, and
    wherein the first transistor is an off-transistor including a second source/second drain region of the first conductivity type, the second source/second drain region surrounding the first portion of the first source/first drain region and at least of the second portion of the first source/first drain region in the first transistor.

2. The semiconductor device of claim 1, wherein the second source/second drain region has a portion surrounding the first portion of the first source/first drain region in the first transistor below the gate.

3. The semiconductor device of claim 1, wherein the first source/first drain regions of the first transistor and second transistor are an N-type.

4. The semiconductor device of claim 1, wherein the first source/drain regions of the first transistor and second transistors are a P-type.

5. The semiconductor device of claim 1, wherein the second transistor is an on-transistor, and the first transistor has a dopant diffusion region in a channel region thereof into which a dopant of a second conductivity type opposite to the first source/drain was injected and the dopant diffusion region controls a threshold voltage of the first transistor.

6. The semiconductor device of claim 5, wherein the first source/first drain regions of the first transistor and second transistor are an N-type.

7. The semiconductor device of claim 5, wherein the first source/first drain regions of the first transistor and second transistor are a P-type.

8. The semiconductor device of claim 5, wherein the first transistor and the second transistor are metal oxide semiconductor (MOS) transistors.

9. The semiconductor device of claim 8, wherein the first off MOS transistor and the second on MOS transistor have an N-type channel.

10. A mask read only memory (ROM) semiconductor device comprising a first transistor and a second transistor each having a first source/first drain region of a first conductivity type, a gate and a spacer on a sidewall of the gate, the first source/first drain region in the first transistor including a first portion under the spacer and a second portion not covered by the spacer, the first portion between the second portion and the gate;
    wherein the first transistor is an off-transistor including a second source/second drain region of the first conductivity type which surrounds the first portion and at least of the second portion of the first source/first drain region in the first transistor and
    wherein the second transistor is an on-transistor.

11. The mask ROM semiconductor device of claim 10, wherein the drain of the first transistor is electrically connected to a bit line, and the gate thereof is connected to a word line.

12. A semiconductor device comprising:
    at least one first transistor; and
    at least one second transistor having an identical conductive type to and a different threshold voltage different from that of the first transistor,
    wherein the first transistor includes a source/drain region of a first conductivity type, a gate, a spacer on a sidewall of the gate, and a buffer dopant region, the source/drain region in the first transistor including a first portion disposed under the spacer and a second portion not covered by the spacer, the first portion between the second portion and the gate, and
    wherein the buffer dopant region surrounds the first portion and at least of the second portion of the source/drain region in the first transistor.

13. The semiconductor device of claim 12, wherein the buffer dopant region has a concentration relatively lower than that of the source/drain region.

14. The semiconductor device of claim 12, wherein the buffer dopant region surrounds the first portion of the source/drain region below a gate of the first transistor.

15. The semiconductor device of claim 5, wherein the dopant diffusion region disposes through an entire channel region in the first transistor.

16. The semiconductor device of claim 1, wherein a concentration of a dopant in the first source/drain region is higher than a concentration of a dopant in the second source/drain region.

17. The semiconductor device of claim 10, wherein a concentration of a dopant in the first source/drain region is higher than a concentration of a dopant in the second source/drain region.

* * * * *